United States Patent
Han et al.

(10) Patent No.: US 7,491,292 B2
(45) Date of Patent: Feb. 17, 2009

(54) APPARATUS FOR CATCHING BYPRODUCTS IN SEMICONDUCTOR DEVICE FABRICATION EQUIPMENT

(75) Inventors: Jung-Hun Han, Suwon-si (KR); Jin-Jun Park, Seoul (KR); Do-In Bae, Changwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 232 days.

(21) Appl. No.: 11/327,408

(22) Filed: Jan. 9, 2006

(65) Prior Publication Data

US 2006/0169411 A1   Aug. 3, 2006

(30) Foreign Application Priority Data

Feb. 1, 2005   (KR) ...................... 10-2005-0009008

(51) Int. Cl.
   *C23F 1/00*   (2006.01)
   *H01L 21/306*   (2006.01)
(52) U.S. Cl. ................................. 156/345.29
(58) Field of Classification Search ............. 156/345.29
   See application file for complete search history.

(56) References Cited

U.S. PATENT DOCUMENTS

| | | | | |
|---|---|---|---|---|
| 1,080,445 A | * | 12/1913 | Hey ........................... | 261/89 |
| 2,984,314 A | * | 5/1961 | Denton ....................... | 96/126 |
| 3,697,748 A | * | 10/1972 | Cohen ......................... | 250/282 |
| 3,731,392 A | * | 5/1973 | Gottfried ..................... | 34/291 |
| 4,178,697 A | * | 12/1979 | Sutherland ................... | 34/92 |
| 5,810,077 A | * | 9/1998 | Nakamura et al. .......... | 165/153 |
| 5,966,353 A | | 10/1999 | Kaneko et al. | |
| 6,206,971 B1 | | 3/2001 | Umotoy et al. | |
| 6,447,158 B1 | * | 9/2002 | Farkas ........................ | 366/316 |

FOREIGN PATENT DOCUMENTS

WO   WO 00/51702   *   9/2000

* cited by examiner

*Primary Examiner*—Parviz Hassanzadeh
*Assistant Examiner*—Keath Chen
(74) *Attorney, Agent, or Firm*—Volentine & Whitt, PLLC (57) ABSTRACT

An apparatus for catching byproducts in semiconductor device processing equipment is disposed in an exhaust line between a process chamber and a vacuum pump. The apparatus includes a cylindrical trap housing member, an upper cover and a lower cover covering the upper part and lower part of the trap housing, respectively, a heater disposed under the upper cover, first and second cooling plates disposed in the trap housing, a post spacing the cooling plates, apart and a cooling system for cooling respective portions of the apparatus. The cooling system includes a delivery pipe for supplying refrigerant, a discharge pipe for discharging the refrigerant from the apparatus, first cooling piping extending through each cooling plate and connected to the delivery and discharge pipes, and second cooling piping extending helically along the outer circumferential surface of the trap housing.

20 Claims, 8 Drawing Sheets

APPARATUS FOR CATCHING BYPRODUCTS IN SEMICONDUCTOR DEVICE FABRICATION EQUIPMENT

BACKGROUND OF THE INVENTION

1. Field of the Invention

The present invention relates to equipment for processing substrates, such as semiconductor substrates. More particularly, the present invention relates to apparatus for catching byproducts of a deposition or etching process, or the like.

2. Description of the Related Art

Generally, semiconductor devices are manufactured by repeatedly performing a variety of processes on a substrate. These processes include a deposition process for forming a film on the substrate, a selective etching process for etching the film, and a diffusion process for doping a region on the substrate with specific atoms. Each of these processes must be performed in a certain specific process environment, namely at a high temperature and at a pressure that is lower than atmospheric pressure. Therefore, the processes are each carried out in a process chamber. In addition, the deposition and etching processes are typically carried out by introducing process gas into the process chamber and applying an RF power to the process gas. As a result, the process gas undergoes a chemical reaction in which the gas is transformed into plasma. The plasma is used to form a film on the substrate or etch a film that has already been formed on the substrate.

In addition, the plasma process produces byproducts such as portions of the process gas that fail to react. Although the byproducts are usually maintained in a gaseous state while under the low pressure and high temperature prevailing in the process chamber, the byproducts can solidify and thereby form a powder under higher pressures or lower temperatures.

A vacuum pump, such as that used to create the low pressure in the process chamber, exhausts the gaseous byproducts from the process chamber through an exhaust line after the deposition or etching process has been completed. However, the vacuum pump and a valve disposed in the exhaust line are in communication with the environment outside the process chamber while the byproducts are being exhausted through the exhaust line. Hence, the byproducts will begin to solidify. The solidified byproducts have a strong adhesive characteristic. Accordingly, the byproducts adhere in large quantities on the blades of the vacuum pump and on the valve disposed in the exhaust line.

That is, the environment under which the byproducts are exhausted differs from that prevailing in the process chamber at the time the byproducts are generated, i.e., the pressure is higher and the temperature is lower at the valve and vacuum pump of the exhaust system than in the process chamber. Therefore, the byproducts tend to solidify to a much greater extent in the exhaust system than in the process chamber, and the solidified byproducts become more adhesive in the exhaust system than in the process chamber. Accordingly, a large amount of the byproducts accumulate in the exhaust system.

As the solidified byproducts accumulate within the exhaust line or the vacuum pump, the cross-sectional area of the exhaust line is reduced and the force that can be exerted by the vacuum pump on the gaseous byproducts is also reduced. Ultimately, the exhaust force is decreased significantly, causing many problems such as a decrease in the quality of the products processed in the process chamber, a reduction in the useful life of the vacuum pump, and a decrease in the productivity of the process due to a need to frequently clean the exhaust system.

Figure 1:
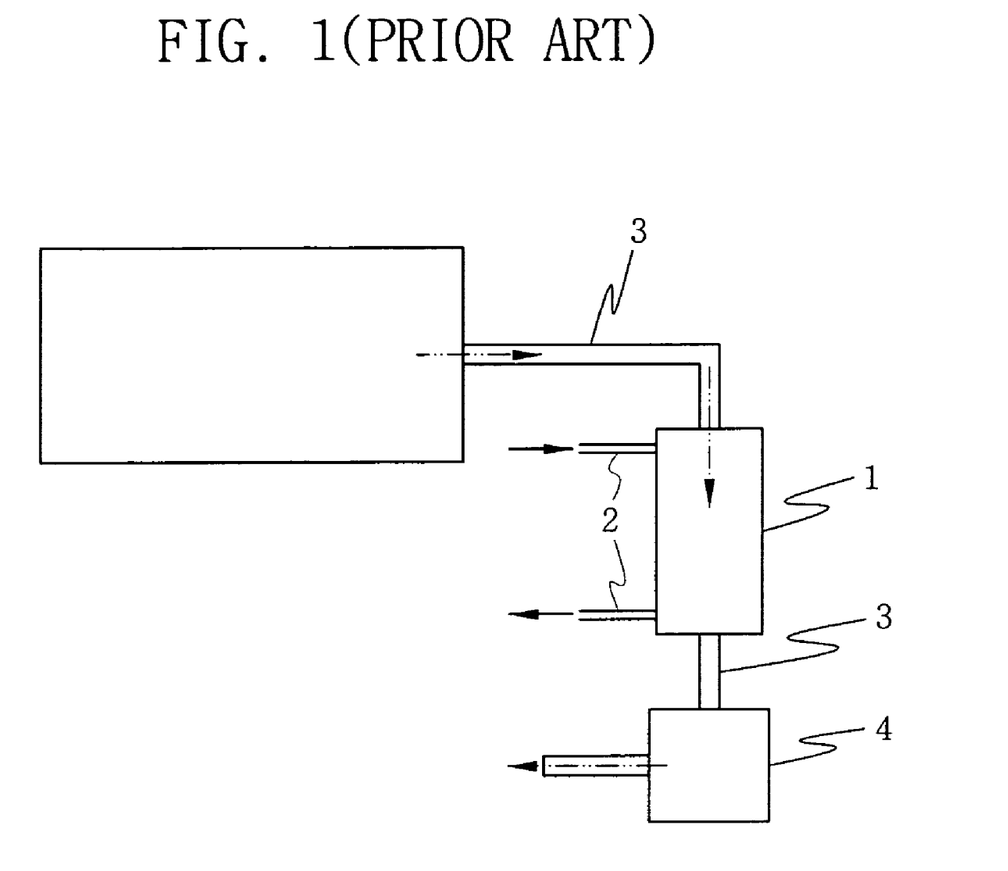
FIG. 1 is a block diagram of conventional semiconductor device processing equipment having an apparatus for catching byproducts.

One apparatus that has been proposed to obviate these problems is shown in FIG. 1. The apparatus includes a separate cooling trap 1 provided in the exhaust line 3 extending from the process chamber, and a cooling pipe 2 extending through the cooling trap 1.

The byproducts passing through the inside of the cooling trap 1 are cooled by a refrigerant passing through the cooling pipe 2 so as to be solidified. Consequently, the solidified byproducts adhere to the inner circumferential surface of the cooling trap 1 or to the outer surface of the cooling pipe 2 in the cooling trap 1. Thus, the quantity of byproducts passing to the vacuum pump 4 is minimized.

However, most of the byproducts caught by the cooling trap 1 are those that adhere to the cooling pipe 2 where the temperature is lowest. The cooling pipe 2 has a relatively small surface area in the cooling trap 1 and thus, only a small amount of the byproducts are actually caught by the cooling trap 1. That is, a large amount of the byproducts still flow to the vacuum pump 4. Accordingly, the above-described problems, e.g., a decrease in the effectiveness and useful life of the vacuum pump 4, still persist.

SUMMARY OF THE INVENTION

Therefore, an object of the present invention is to overcome the problems and disadvantages of the prior art.

More specifically, one object of the present invention is to provide an apparatus for efficiently catching byproducts, produced in equipment for processing a substrate using a reaction gas, such that the byproducts do not pass into a vacuum pump or into a portion of an exhaust line leading to the vacuum pump.

Another object of the present invention is to provide an apparatus for catching byproducts, produced in equipment for processing a substrate using a reaction gas, in a way that prevents the force exerted by the vacuum pump from decreasing.

According to one aspect of the present invention, the apparatus for catching byproducts includes a tubular trap housing, a first cover having a first cover plate covering one end of the trap housing and an inlet at a central portion of the cover plate, a heater disposed adjacent the inlet, a second cover having a second cover plate covering the other end of the trap housing and an outlet at a central portion of the second cover plate, first and second cooling plates disposed within and extending across the trap housing, a pipe-like post connecting central portions of the first cooling plate and the second cooling plate as disposed coaxially with the trap housing so as to space the first and second cooling plates apart, and a cooling system defining a first cooling passageway in each of the cooling plates.

The first cooling plate has a plurality of exhaust holes extending therethrough at the outer peripheral portion thereof. The second cooling plate has an exhaust hole extending through a central portion thereof. The post has an inner diameter at least equal to the diameter of the exhaust hole of the second cooling plate, and a plurality of ventilation openings extending radially therethrough. Therefore, the exhaust holes of the cooling plates and the ventilation openings in the post constitute a serpentine flow passageway along which the byproducts must pass through the trap housing. As the heater is operated, and refrigerant is fed through the first cooling passageway, the byproducts undergo a drastic reduction in temperature and thus solidify and adhere to surfaces of the cooling plates.

According to another aspect of the present invention the cooling system also comprises a delivery pipe extending outside the trap housing and connected to a first end of the first cooling passageway in each of the cooling plates, and a discharge pipe extending outside the trap housing and connected to a second end of the first cooling passageway in each of the cooling plates.

The cooling system preferably comprises a cooling pipe extending helically along the outer circumferential surface of the trap housing so that byproducts also solidify and adhere to the inner circumferential surface of the trap housing.

According to yet another aspect of the present invention, the apparatus is incorporated into equipment for processing a substrate using a reaction gas. The equipment includes a process chamber having an exhaust outlet, and a vacuum pump connected to the process chamber via the exhaust line and exhaust outlet. In this case, the trap housing is oriented with the longitudinal axis thereof extending vertically.

By maximizing the area where the byproducts are adsorbed, while creating a sudden drop in the temperature of the byproducts as the byproducts pass through the trap housing, the present invention causes most of the byproducts to solidify and adhere to surfaces within the trap housing. That is, hardly any of the byproducts that have solidified or which could solidify pass out of the trap housing to the vacuum pump.

Accordingly, the efficiency of the process carried out in the process chamber is enhanced, and the process produces a relatively high yield of products. In addition the useful life of the vacuum pump, which is an expensive piece of equipment, is prolonged. Still further, the process chamber does not have to be cleaned frequently.

BRIEF DESCRIPTION OF THE DRAWINGS

The above and other objects, features and advantages of the present invention will become more apparent to those of ordinary skill in the art by referring to the following detailed description of the preferred embodiments thereof made with reference to the attached drawings in which.

DETAILED DESCRIPTION OF THE PREFERRED EMBODIMENTS

The present invention will now be described with reference to the drawings. Like reference numbers designate like elements throughout the drawings.

The apparatus for catching byproducts according to the present invention is provided in an exhaust line through which byproducts are exhausted from a process chamber, as basically illustrated in the arrangement of the prior art shown in FIG. 1. The apparatus enhances the solidifying of the byproducts by suddenly lowering temperature in a space through which the byproducts pass. And, the interior parts of the apparatus at which the relatively low temperature is produced have a large surface area such that most of the solidified byproducts are caught by the apparatus.

Figure 2:
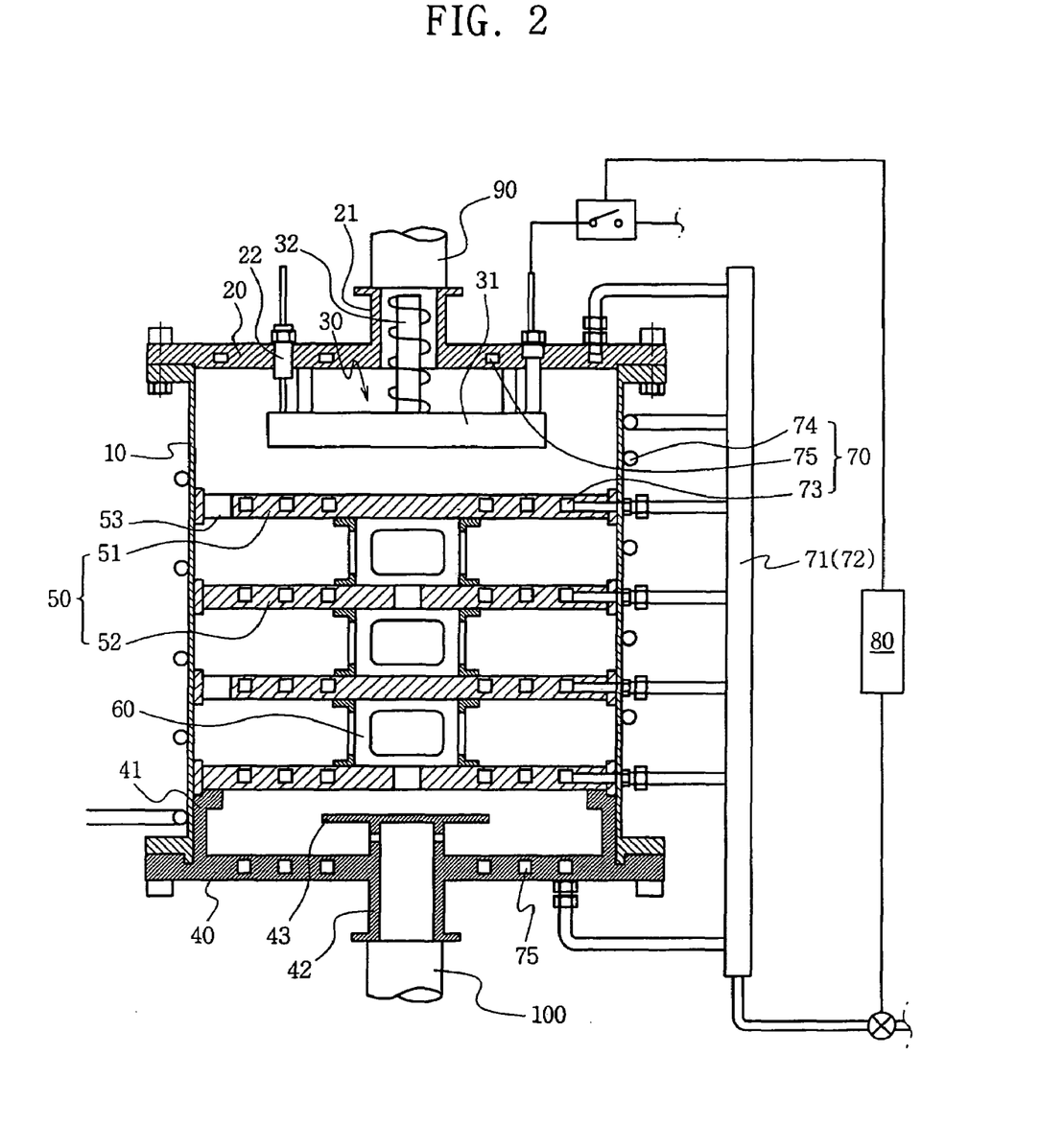
FIG. 2 is a cross-sectional view of an apparatus for catching byproducts in semiconductor device processing equipment according to the present invention.

For these purposes, the apparatus comprises a trap housing 10, an upper cover 20, a heater 30, a lower cover 40, cooling members 50, posts 60, a cooling system 70 and a controller 80.

The trap housing 10 is tubular, and the inner diameter of the trap housing 10 is larger than the inner diameter of the exhaust line. When in use, the trap housing 10 extends vertically as disposed in-line with the exhaust line.

Figure 8:
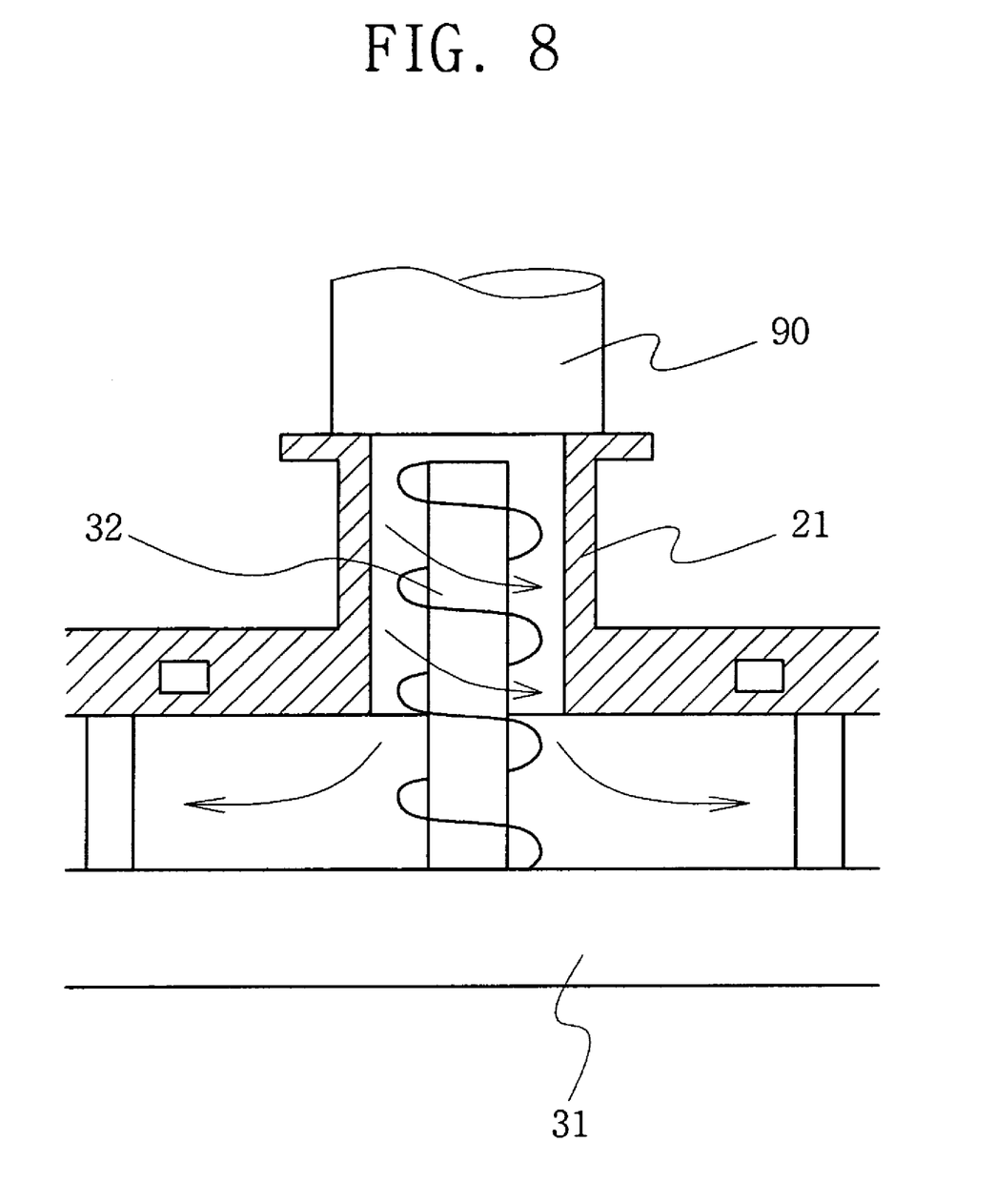
FIG. 8 is an enlarged view of an inlet of the cooling trap of the apparatus for catching byproducts according to the present invention.

The upper cover 20 comprises a cover plate and an inlet 21. The cover plate has a central opening extending therethrough and is disposed over an (upper) end of the trap housing 10 with the outer circumferential portion thereof securely connected to the trap housing 10. The inlet 21 is a pipe that projects (upwardly) from the cover plate as aligned with the central opening in the cover plate. In addition, a temperature sensor 22 is disposed on the bottom of the upper cover 20 to measure the temperature inside the trap housing 10. One end of the exhaust line is connected to a process chamber and another end 90 thereof is firmly connected to the inlet 21 of the upper cover 20. In this respect, the cooling trap is connected as close as possible to the process chamber via the exhaust line.

The heater 30 comprises a heating plate 31 and a spiral vane 32. The heating plate 31 is a flat plate disposed beneath the cover plate of the upper cover 20 as spaced a predetermined distance from the inlet 21. The vane 32 extends as perpendicular to and upwardly from the center of the upper surface of the heating plate 31 into the inlet 21 of the upper cover member 20. The outer diameter of the vane 32 is smaller that the inner diameter of the inlet 21 such that a gap is left between the vane 32 and the inner surface of the inlet 31. The heating plate 31 comprises a resistive heating wire embedded therein. By this means, the heating member 30 can be heated to about 250° C. to 350° C.

The lower cover 40 comprises a flat cover plate that covers the other (lower) end of the trap housing 10, a guide 41, and an outlet 42. The guide 41 is in the form of a pipe and projects (upwardly) from the cover plate into engagement with the inner wall surface of the trap housing member 10. The outlet 42 is also in the form of a pipe but projects (downwardly) from the opposite side of the flat cover plate at a central portion thereof. An end 100 of a portion of the exhaust line leading to the vacuum pump is connected to the outlet 42.

Preferably, the outlet 42 has an upper end that extends into the trap housing 10 and is covered within the trap housing 10 by a baffle plate 43. The upper end of the outlet 42 has a number of exhaust holes extending radially therethrough so as to place the interior of the trap housing 10 in communication with the end 100 of the exhaust line leading to the vacuum pump. The baffle plate has a diameter that is greater then the outer diameter of the upper end of the outlet 42.

Figure 3:
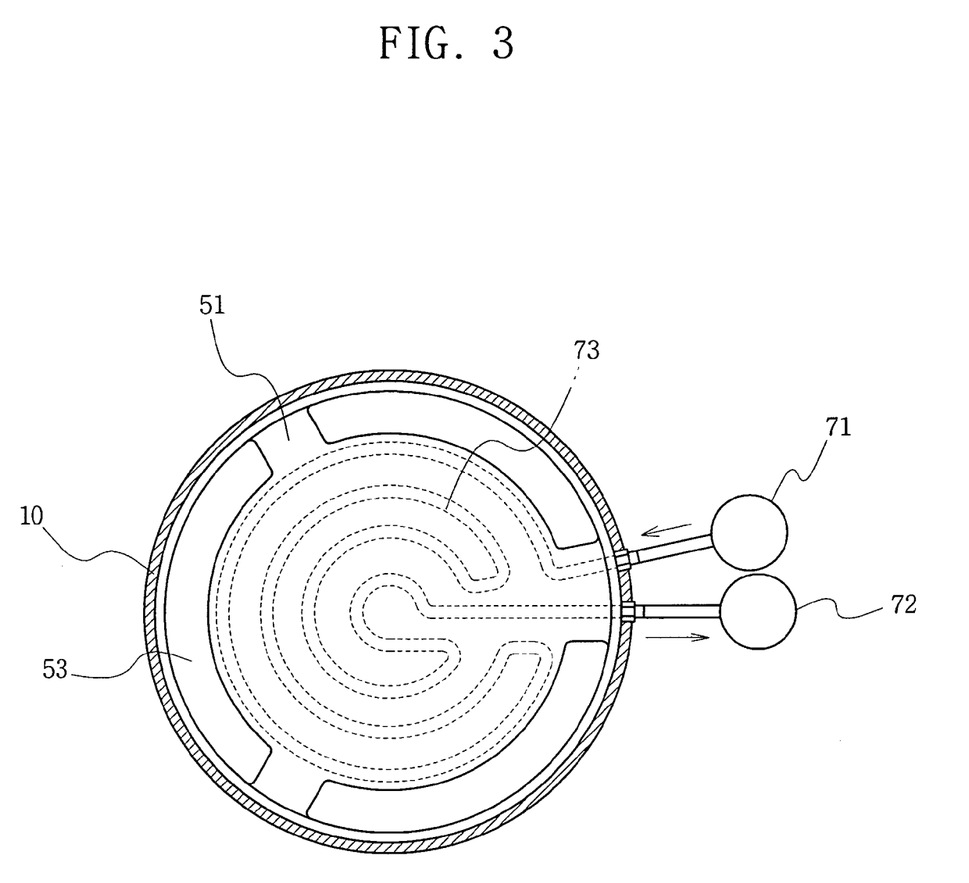
FIGS. 3 and 4 are sectional views of cooling plate members, respectively, of the apparatus for catching byproducts according to the present invention.
Figure 4:
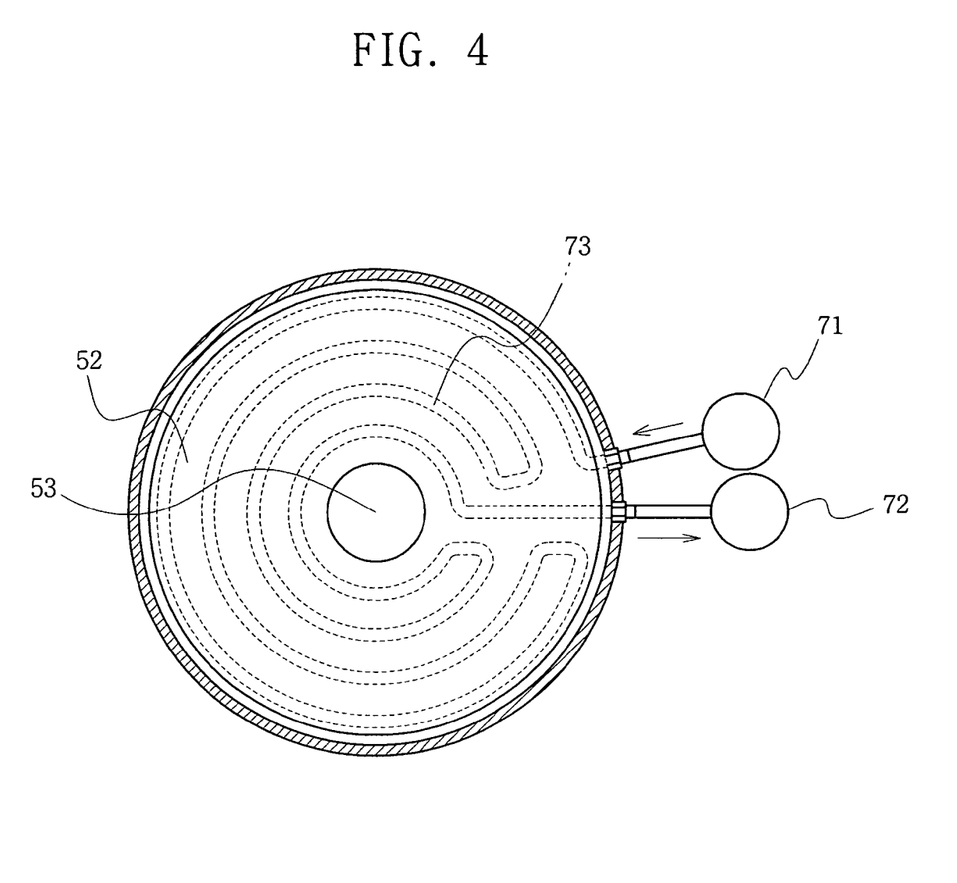

Each of the cooling plate members 50 comprises a first cooling plate 51 and a second cooling plate 52 shown in FIGS. 3 and 4, respectively. The first cooling plate 51 comprises a base plate having a plurality of exhaust holes 53 extending therethrough and forming notches in the outer circumferential portion thereof. The second cooling plate 52 comprises a base plate having an exhaust hole 53 extending through the center thereof.

Figure 5:
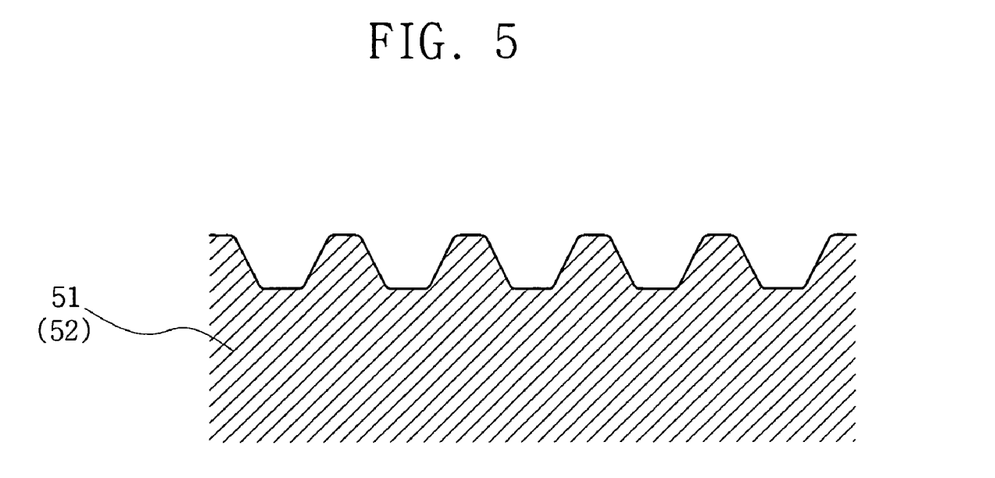
FIG. 5 is a sectional view of part of a cooling plate member of the apparatus for catching byproducts according to the present invention.
Figure 6:
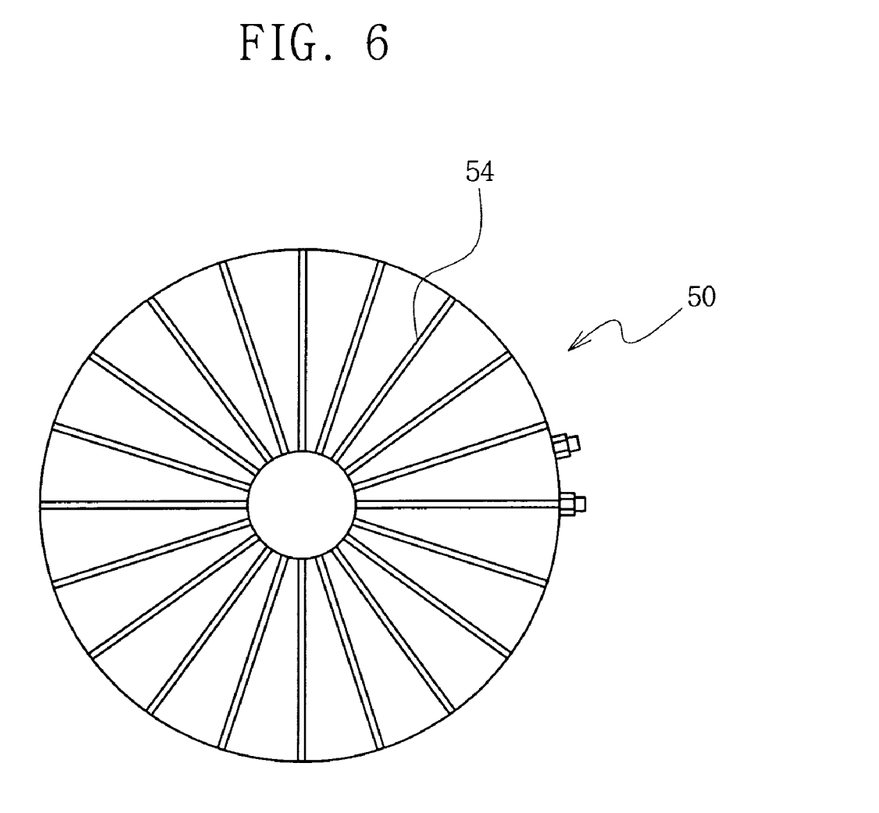
FIG. 6 is a plan view of another form of the cooling plate member of the apparatus for catching byproducts according to the present invention.

The effective surface area of a cooling plate 51, 52 can be increased by forming the cooling plate with an uneven upper surface in the form of, for example, undulations, as shown in FIG. 5. Alternatively, or in addition, the effective surface area of a cooling plate 51, 52 can be increased by attaching thin plates 54 to the upper surface thereof, as shown in FIG. 6. These plates 54 project upwardly from the upper surface of the cooling plate and extend radially as spaced at regular intervals from one another.

Figure 7:
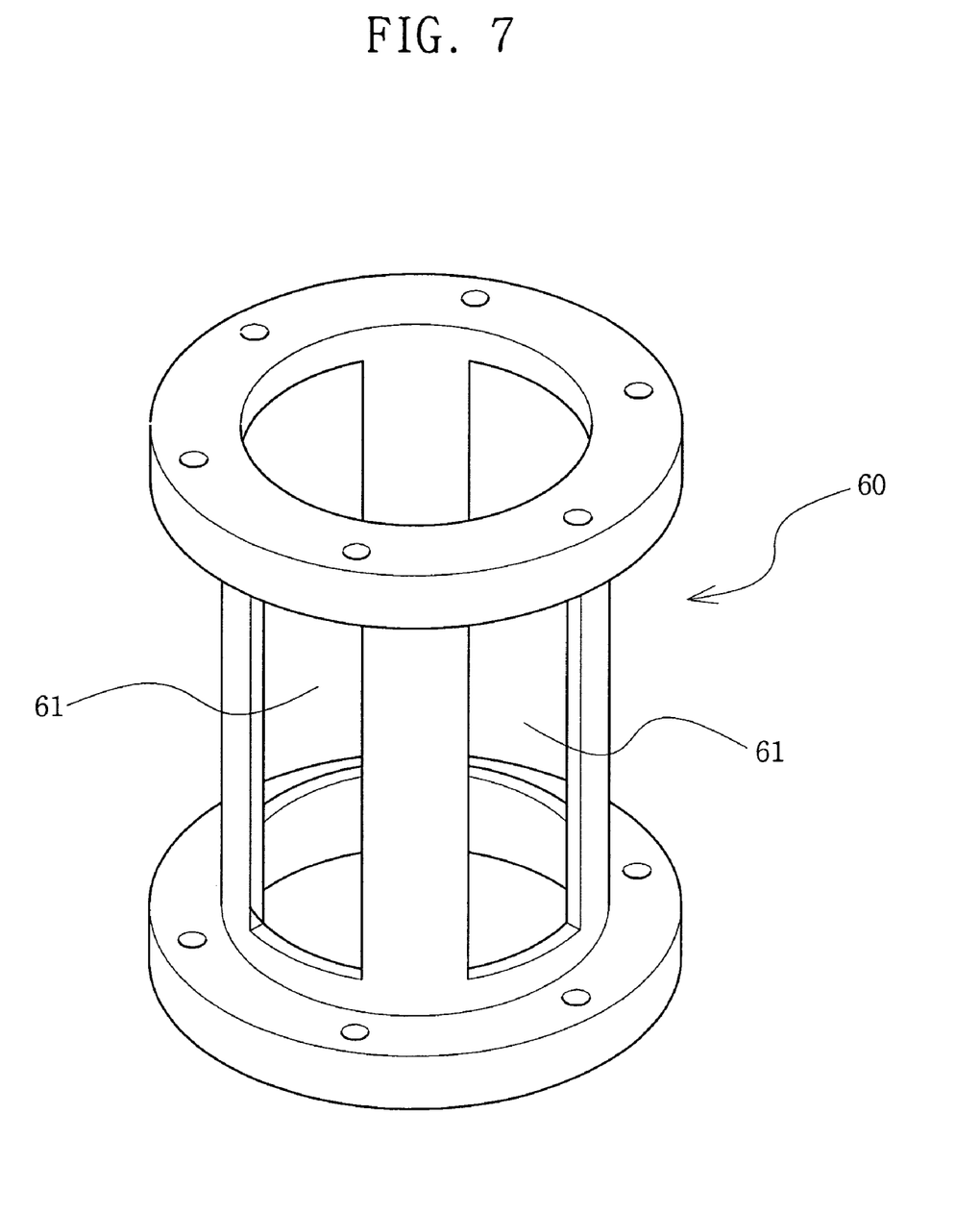
FIG. 7 is a perspective view of a post member of the apparatus for catching byproducts according to the present invention.

As shown in FIGS. 2 and 7, each post 60 is in the form of a pipe and connects the central parts of each adjacent pair of the first and second cooling plates 51, 52 so as to space the first and second cooling plates 51, 52 a predetermined distance from one another within the trap housing 10. The inner diameter of the post 60 is larger than the exhaust hole 53 of the second cooling plate 52, and a plurality of ventilation openings 61 extend radially therethrough as spaced from one another along the circumference of the post 60. Therefore, the post 60 provides a passage enabling the byproduct-gas to move smoothly from one cooling plate to another.

In addition, a plurality of the first and second cooling plates 51, 52 are connected by the posts 60 so that the cooling members 50 are stacked (vertically) in the trap housing 10 as fixed to one another. As shown in FIG. 2, the lowermost cooling member 50 is supported on the upper end of the guide 41 of the lower cover member 40.

Next, the cooling system 70 comprises a delivery pipe 71 for supplying refrigerant to the cooling trap, a discharge pipe 72 for discharging the refrigerant from the cooling trap, first cooling piping 73 and second cooling piping 74. The delivery pipe 71 and the discharge pipe 72 extend (vertically) parallel to the trap housing 10 at the outside of the trap housing 10, as shown in FIGS. 2, 3 and 4. Thus, the refrigerant can be simultaneously supplied to different portions of the cooling trap and likewise, the refrigerant can be simultaneously discharged from different portions of the cooling trap.

The first cooling pipe 73 and the second cooling pipe 74 are connected to the delivery pipe 71 and the discharge pipe 72, respectively. The first cooling piping 73 defines cooling passageways extending through the first cooling plate 51 and the second cooling plate 52. The cooling passageways are configured so as to facilitate an efficient and uniform heat exchange (cooling of the gas byproducts) at the surfaces of the base plates of the first cooling plate 51 and the second cooling plate 52. The second cooling piping 74 extends helically along the outer circumferential surface of the trap housing 10 as closely adhered to the outer circumferential surface so that the side of the trap housing 10 is cooled. Preferably, the refrigerant flows from top to bottom through the second cooling piping 74.

The cooling system 70 also preferably comprises third cooling piping 75 defining cooling passageways within the upper cover 20 and the lower cover 40. The third cooling piping 75 is also connected to the delivery pipe 71 and the discharge pipe 72.

The controller 80 controls the heater 30 and the flow of refrigerant into the delivery pipe refrigerant 71 of the cooling system 70.

The present invention as described above operates as follows.

First, power is applied to the heater 30 under the command of the controller 80 at the time the vacuum pump connected to exhaust pipe 100 is operated. Accordingly, the heating plate 31 and the vane 32 are heated to a predetermined temperature.

Then, refrigerant is supplied to the delivery pipe 71 as initiated under the command of the controller 80.

Consequently, the byproducts which are forcibly exhausted from the process chamber by the vacuum pump are exhausted through the exhaust line and flow into the housing 10 of the cooling trap through the inlet 21 of the upper cover 20. There, the byproducts are heated so as to remain gaseous. The gaseous byproducts are diffused within the trap housing 10 by the vane 32.

Figure 9:
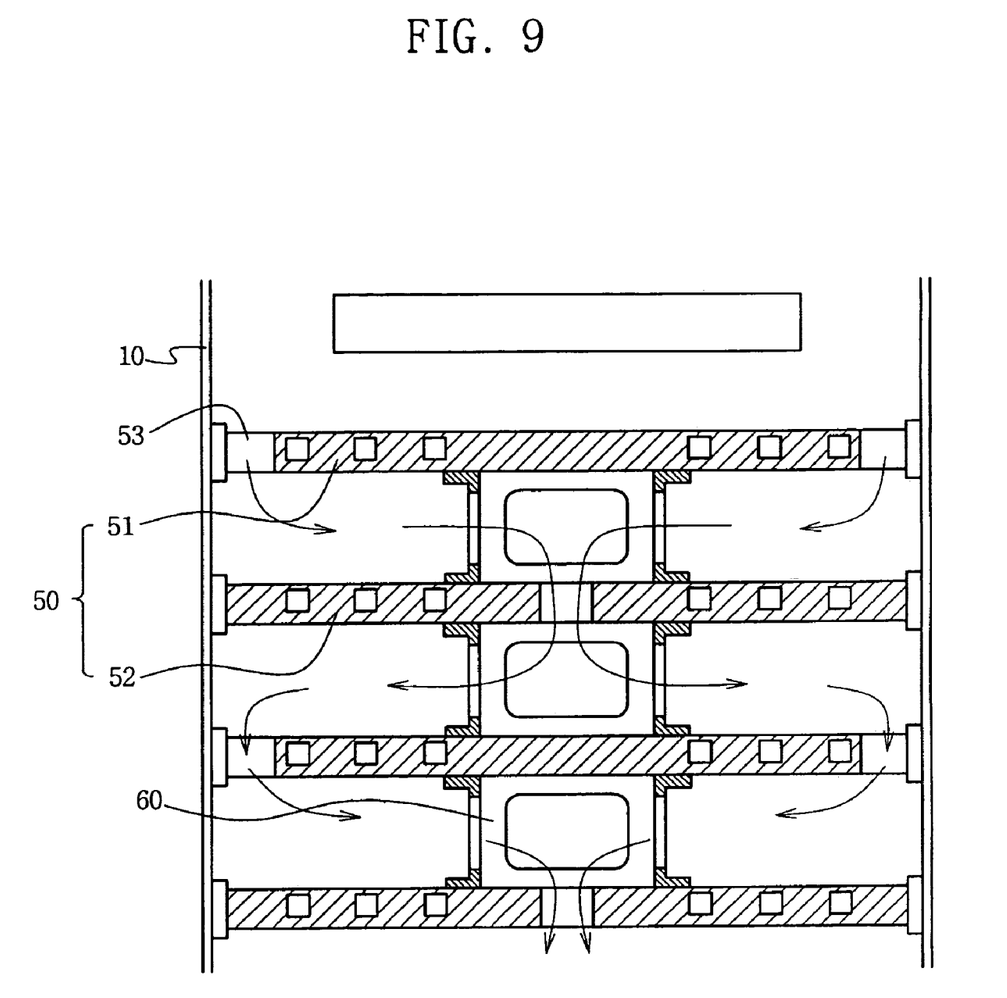
FIG. 9 is an enlarged view of interior parts of the cooling trap.

The byproducts then flow through the exhaust holes 53 in the outer circumferential portion of the first cooling plate 51 and the middle of the second cooling plate 52, as shown in FIG. 9. At the same time, refrigerant is flowing through the cooling passageway defined by the first cooling piping 73, whereby a sudden change in temperature is created between the heater 30 and the first cooling plate 51. Thus, the temperature of the byproducts heated when passing through the heater 30 is suddenly lowered at the first cooling plate 51.

At this time, these byproducts solidify into powder that is highly adhesive. Specifically, it is noted that the adhesiveness of the byproducts increases at the portions of the trap that are cooler. The byproducts thus solidified into power state adhere to the upper surface of the first cooling plate 51 as cooled by the refrigerant flowing through the first cooling pipe 73, and the byproducts not yet solidified at or adhered to the first cooling plate 51 flow through the exhaust hole 53 in the outer circumferential portion of the first cooling plate 51.

From there, the byproducts are led into the post 60 through the ventilation opening 61 in the post 60. The byproducts then flow to the bottom of the second cooling plate 52 though the exhaust hole 53 in the middle of the second cooling plate 52. During this phase, some of the byproducts are adhered to the upper surface of the second cooling plate 52.

In this way, only a small amount of the byproducts do not adhere to a cooling plate member 50. Eventually, these byproducts find their way to the lower cover 40. A quantity of these byproducts, i.e., those which pass through the lowermost cooling plate member 50, adhere to the exhaust manifold 43. Thus, little, if any, of the byproducts pass through the outlet 42 of the lower cover 40.

In particular, the third cooling piping 75 cools the lower cover 40. The temperature of the byproducts passing through the inlet 21 of the trap housing 10 decreases more and more as the byproducts flow towards the lower cover. Even that small amount of the byproducts that reaches the lower cover 40 is cooled and thus, adheres to the lower cover 40 within the cooling trap. Accordingly, hardly any of the byproducts that are solidified or that are capable of solidifying pass through the outlet 42.

Furthermore, the byproducts flowing through the exhaust holes 53 of the cooling plate member 50 adhere to the inner circumferential surface of the trap housing 10 because the trap housing 10 is cooled directly by refrigerant flowing through the third cooling piping 75. That is, the provision of the third cooling piping 75 of the cooling system on the outside of the trap housing 10 further maximizes the amount of byproducts caught by the cooling trap.

According to the present invention as described in detail above, the temperature of the byproducts exhausted from the process chamber is suddenly lowered inside of the trap housing 10 such that the gaseous byproducts are converted into a powder that that has a strong adhesive characteristic. At the same time, the flow passage within the trap housing 10, as constituted in part by the exhaust hole 53 at the outer circumferential surface of each first cooling plate 51 and the exhaust hole 53 in the middle of each second cooling plate 52, is maximized. In addition, a large surface area that is presented along the flow passage, namely the total surface area presented by the cooling plate member(s) 50, the trap housing 10, and the lower cover 40, is cooled by the cooling system 70. Therefore, the percentage of the gaseous byproducts that are solidified and caught within the cooling trap is maximized. Hence, the exhaust force exerted by the vacuum pump on the gas within the process chamber is prevented from decreasing, whereby the process performance is maintained.

In addition, the present invention enables the process chamber and, in fact, the entirety of the equipment to be cleaned less frequently by ensuring that the force by which the vacuum pump evacuates the process chamber is maintained during the process performed in the process chamber. Thus, the present invention contributes to enhancing the overall productivity of the process.

In addition, the present invention can be easily assembled and disassembled, can be easily replaced and can be easily provided in the exhaust line. Thus, the present invention contributes to minimizing the cleaning process including that of cleaning the process chamber itself.

Still further, the present invention prevents the byproducts from agglomerating in the exhaust line and the vacuum pump. Hence, the present invention extends the useful life of the vacuum pump.

Finally, the present invention has been described above in connection with the preferred embodiments thereof. However, it is to be understood that various modifications of and alternatives to features of the disclosed embodiments will be apparent to those of ordinary skill in the art. Therefore, the true spirit and scope of the invention is not limited to the preferred embodiments as described above but by the scope of the appended claims.

What is claimed is:

1. An apparatus for catching byproducts, comprising:
   a tubular trap housing;
   a first cover having a first cover plate connected to and covering one end of the trap housing, and an inlet at a central portion of the cover plate, the inlet defining a passageway leading into the trap housing;
   a heater disposed adjacent the inlet so as to heat gaseous byproducts entering the trap housing through the inlet;
   a second cover having a second cover plate connected to and covering the other end of the trap housing, and an outlet at a central portion of the second cover plate, the outlet defining a passageway leading out of the trap housing;
   a first cooling plate disposed within and extending across the trap housing, the first cooling plate having a plurality of exhaust holes extending therethrough at the outer peripheral portion thereof;
   a second cooling plate disposed within and extending across the trap housing as spaced from the first cooling plate in the axial direction of the trap housing, the second cooling plate having a circular exhaust hole extending through a central portion thereof;
   a single post disposed coaxially with the trap housing, the post comprising a pipe spaced radially inwardly of the trap housing such an annular space is delimited by and between the pipe and an inner surface of the housing, the pipe extending from a central portion of the first cooling plate to a central portion of the second cooling plate and connecting the central portions so as to space the first and second cooling plates in the axial direction of the trap housing, said post and the pipe having an inner diameter at least equal to the diameter of the exhaust hole of the second cooling plate, and a plurality of ventilation openings extending radially therethrough so as to open into the annular space delimited by and between the pipe and the inner surface of the housing; and
   a cooling system defining a first cooling passageway in each of the cooling plates.

2. The apparatus according to claim 1, and further comprising a temperature sensor disposed on the bottom of the first cover.

3. The apparatus according to claim 1, wherein said heater comprises a plate in which a resistive heating wire is disposed and a vane, the vane extending into said inlet from the plate in which the resistive heating wire is disposed.

4. The apparatus according to claim 1, wherein the outlet has an inner end in the form of a pipe extending within the trap housing, the inner end having a plurality of exhaust holes extending radially therethrough, and a flat baffle plate having a diameter larger than the outer diameter of the inner end of said outlet and covering the inner end of said outlet within the trap housing.

5. The apparatus according to claim 1, wherein the first and second cooling plates each have an uneven surface at a side thereof that faces towards the inlet.

6. The apparatus according to claim 1, wherein each of the first and second cooling plates has a plurality of fins projecting from and integral with a surface at a side thereof that faces towards said inlet.

7. The apparatus according to claim 1, wherein said cooling system also defines a cooling passageway within said second cover.

8. The apparatus according to claim 1, wherein said second cover has a tubular guide that extends from said second cover plate and is received by an end portion of the trap housing.

9. The apparatus according to claim 1, wherein said cooling system comprises a delivery pipe extending outside the trap housing and connected to a first end of the first cooling passageway in each of said cooling plates such that refrigerant can be delivered to the first cooling passageway in each of said cooling pipes via the delivery pipe, and a discharge pipe extending outside the trap housing and connected to a second end of the first cooling passageway in each of said cooling plates such that refrigerant can be discharged from the first cooling passageway in each of said cooling pipes via the delivery pipe.

10. The apparatus according to claim 1, wherein said cooling system further comprises a cooling pipe extending helically along the outer circumferential surface of the trap housing.

11. Processing equipment for processing a substrate using a reaction gas, said equipment comprising:
    a process chamber having an exhaust outlet;
    an exhaust line connected to the exhaust outlet of the process chamber so as to lead from the process chamber;
    a vacuum pump connected to the exhaust line;
    a cooling trap disposed in the exhaust line as interposed between the vacuum pump and the process chamber, said cooling trap comprising
    a tubular trap housing oriented with the longitudinal axis thereof extending vertically,
    an upper cover having an upper cover plate connected to and covering an upper end of the trap housing, and an inlet at a central portion of the cover plate, the inlet connected to a portion of the exhaust line extending from the process chamber, and the inlet defining a passageway leading into the trap housing,
    a heater disposed adjacent the inlet so as to heat gaseous byproducts entering the trap housing through the inlet,
    a lower cover having a lower cover plate connected to and covering the lower end of the trap housing, and an outlet at a central portion of the lower cover plate, the outlet connected to a portion of the exhaust line extending to the vacuum pump, and the outlet defining a passageway leading out of the trap housing, a first cooling plate disposed within and extending across the trap housing, the first cooling plate having a plurality of exhaust holes extending therethrough at the outer peripheral portion thereof;

a second cooling plate disposed within and extending across the trap housing as spaced from the first cooling plate in the axial direction of the trap housing, the second cooling plate having a circular exhaust hole extending through a central portion thereof, and a single post disposed coaxially with the trap housing, the post comprising a pipe spaced radially inwardly of the trap housing such an annular space is delimited by and between the pipe and an inner surface of the housing, the pipe extending from a central portion of the first cooling plate to a central portion of the second cooling plate and connecting the central portions so as to space the first and second cooling plates in the axial direction of the trap housing, said post and the pipe having an inner diameter at least equal to the diameter of the exhaust hole of the second cooling plate, and a plurality of ventilation openings extending radially therethrough so as to open into the annular space delimited by and between the pipe and the inner surface of the housing; and a cooling system defining a first cooling passageway in each of the cooling plates.

12. The equipment according to claim 1, wherein the cooling trap further comprises a temperature sensor disposed on the bottom of the upper cover.

13. The equipment according to claim 11, wherein said heater comprises a plate in which a resistive heating wire is disposed and a vane, the vane extending into said inlet from the plate in which the resistive heating wire is disposed.

14. The equipment according to claim 11, wherein the outlet of the trap housing has an inner end in the form of a pipe extending within the trap housing, the inner end having a plurality of exhaust holes extending radially therethrough, and a flat baffle plate having a diameter larger than the outer diameter of the inner end of said outlet and covering the inner end of said outlet within the trap housing.

15. The equipment according to claim 11, wherein each of the first and second cooling plates has a plurality of fins projecting from and integral with an upper surface thereof.

16. The equipment according to claim 15, wherein the first and second cooling plates of the cooling trap each have an uneven upper surface.

17. The equipment according to claim 11, wherein said cooling system also defines a cooling passageway within said lower cover.

18. The equipment according to claim 11, wherein said second cover of the cooling trap has a tubular guide that extends from said lower cover plate and is received by an end portion of the trap housing.

19. The equipment according to claim 11, wherein said cooling system comprises a delivery pipe extending outside the trap housing and connected to a first end of the first cooling passageway in each of said cooling plates such that refrigerant can be delivered to the first cooling passageway in each of said cooling pipes via the delivery pipe, and a discharge pipe extending outside the trap housing and connected to a second end of the first cooling passageway in each of said cooling plates such that refrigerant can be discharged from the first cooling passageway in each of said cooling pipes via the delivery pipe.

20. The equipment according to claim 11, wherein said cooling system further comprises a cooling pipe extending helically along the outer circumferential surface of the trap housing.

* * * * *